United States Patent [19]

Yau et al.

[11] Patent Number: 4,837,185

[45] Date of Patent: Jun. 6, 1989

[54] PULSED DUAL RADIO FREQUENCY CVD PROCESS

[75] Inventors: Leopoldo D. Yau, Portland; Galen H. Kawamoto, Beaverton, both of Oreg.

[73] Assignee: Intel Corporation, Santa Clara, Calif.

[21] Appl. No.: 262,990

[22] Filed: Oct. 26, 1988

[51] Int. Cl.$^4$ ............... H01L 21/00; H01L 21/02; H01L 21/31; H01L 21/469

[52] U.S. Cl. ..................... 437/228; 427/39; 427/42; 437/235; 204/192.12

[58] Field of Search ........... 437/228; 427/39, 42; 204/192.12, 192.15

[56] References Cited

U.S. PATENT DOCUMENTS 4,539,068  9/1985  Takagi et al. .............. 437/170
4,766,471  8/1988  Ovshinsky et al. ............. 357/2

Primary Examiner—Brian E. Hearn
Assistant Examiner—B. Everhart
Attorney, Agent, or Firm—Blakely, Sokoloff, Taylor & Zafman

[57] ABSTRACT

A method of depositing a thin film of silicon oxynitride ($Si_xO_yN_z$) onto a semiconductor substrate utilizing dual frequency plasma enhanced chemical vapor deposition (PECVD). Plasma formation is achieved by striking gases in a reaction chamber with a high voltage, low frequency radio wave, and then triggering and applying with the leading or trailing edge of the striking pulse, a second high frequency, low power radio wave. The plasma transfers energy into reactant gases forming a thin film of silicon oxynitride ($Si_xO_yN_z$) onto a semiconductor substrate. The high frequency pulses provides more efficient gas ionization and less pattern, and back oxide sensitivity to film deposition rate.

16 Claims, 4 Drawing Sheets

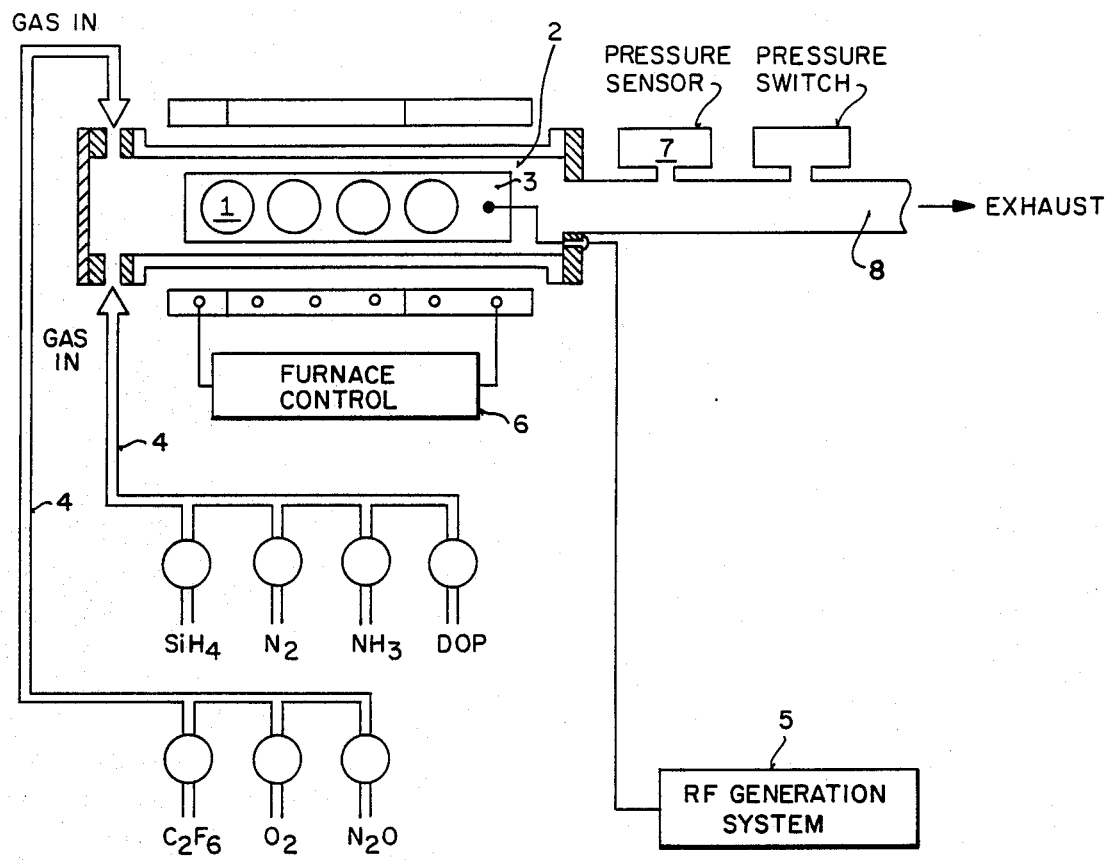
FIG_1
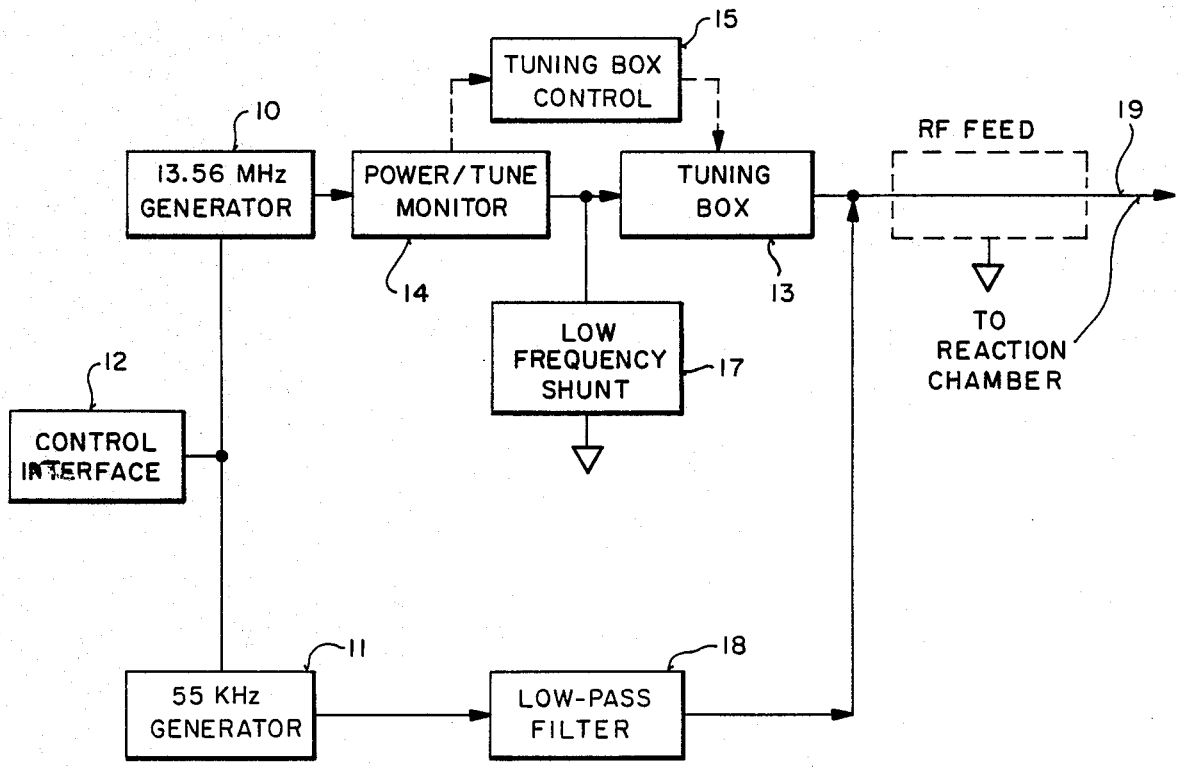
FIG_2

FIG_3A
TE: TRAILING EDGE TRIGGER
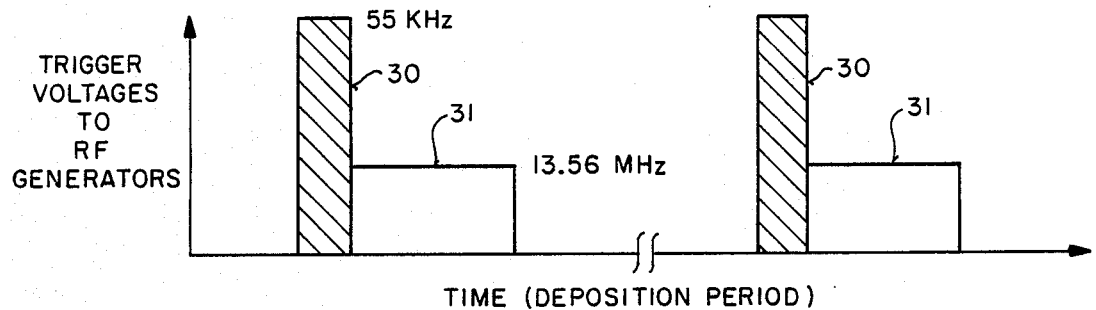
FIG_3B
LE: LEADING EDGE TRIGGER
EXAMPLE { 55 KHz - 6 mSEC ON
13.56 MHz - 55 mSEC ON
OFFTIME - 340 mSEC ON }
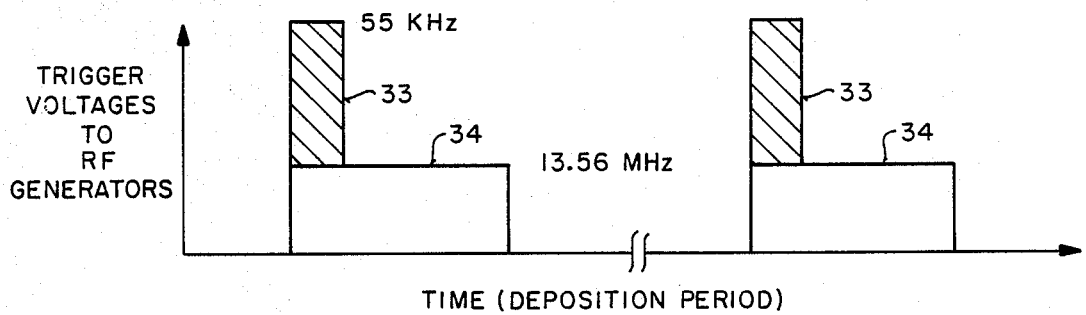
FIG_3C
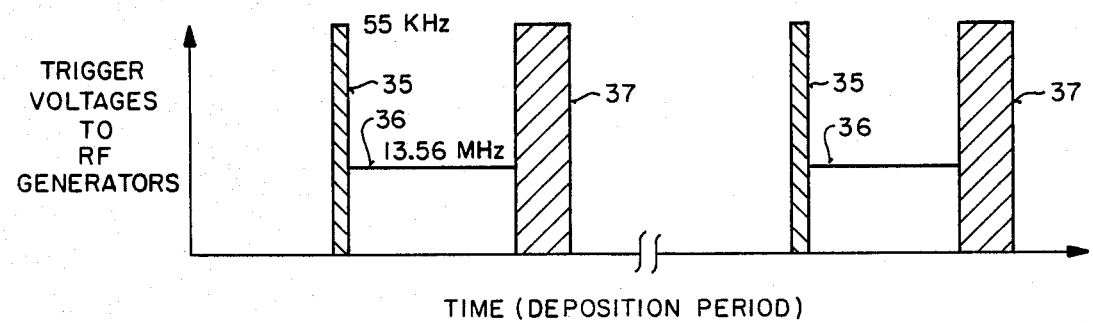

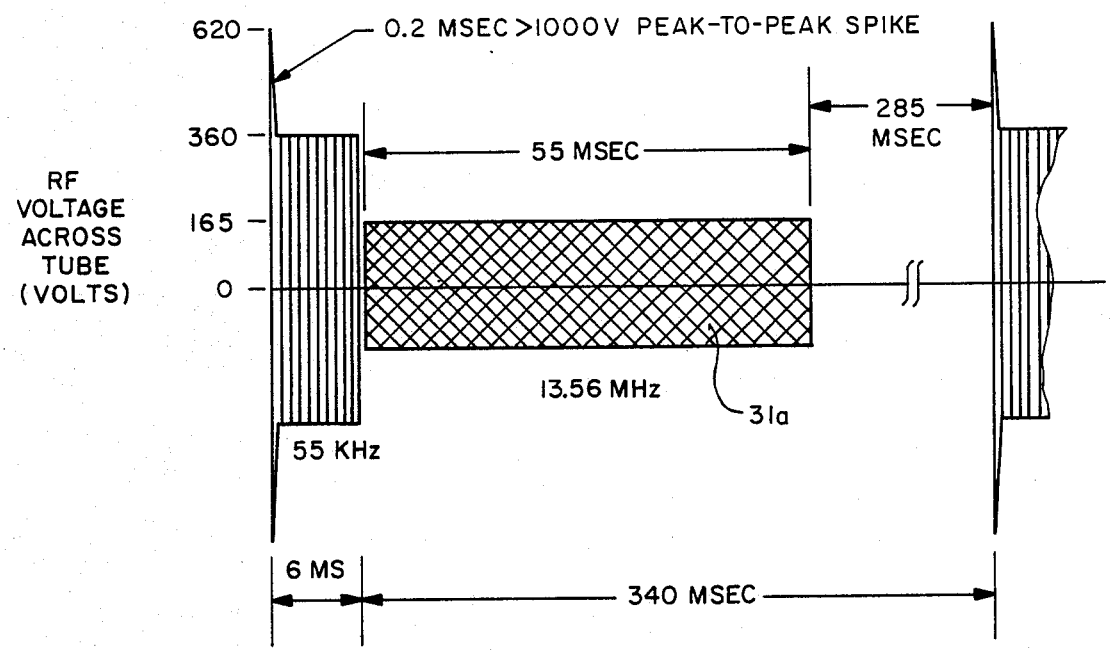
FIG_3D TIMING OF RF VOLTAGE ACROSS TUBE LOAD. FOR 60 POSITION SLED, 55 KHz P=950 W, 13.56 MHz P= 350 W.
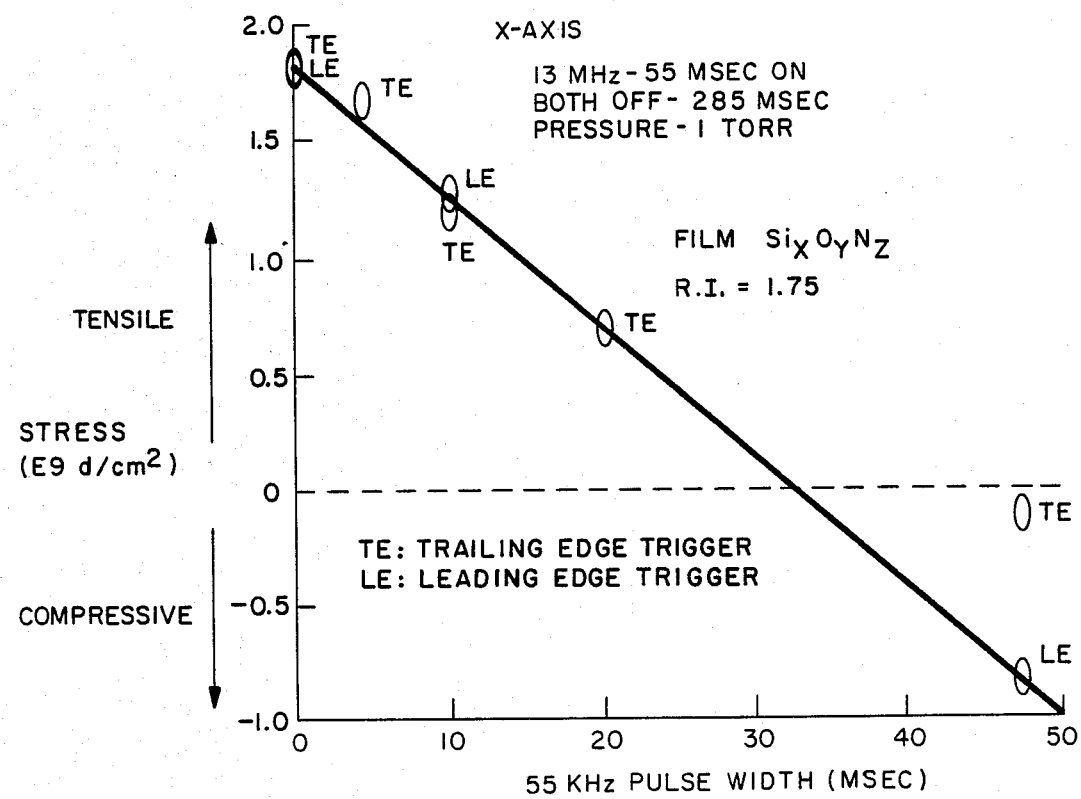
FIG_4

FIG._5
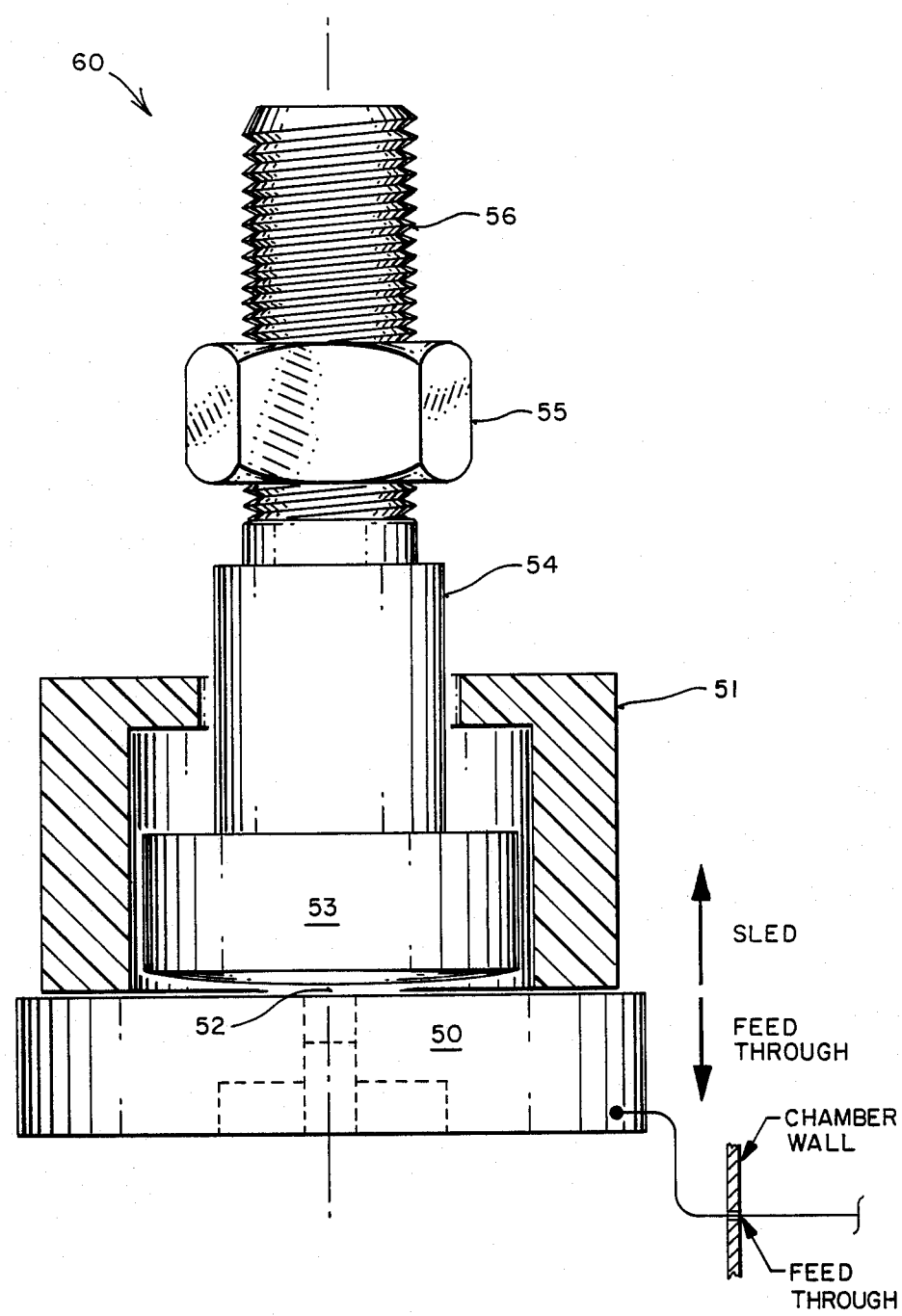

PULSED DUAL RADIO FREQUENCY CVD PROCESS

BACKGROUND OF THE INVENTION

1. Field of the Invention

This invention relates to the field of chemical vapor deposition (CVD) onto a semiconductor substrate, and more particularly plasma enhanced chemical vapor deposition (PECVD) which utilizes a radio frequency (rf) field to supply energy to gaseous reactants.

2. Prior Art

In manufacturing semiconductor devices, it is often necessary to deposit a thin film on a semiconductor substrate. The purpose of the film in the completed semiconductor can vary from electrical conduction, insulation or for its semiconductor properties. The chemical composition of the film generally determines its function. Of concern in this application is the deposition of an amorphous dielectric, silicon nitride, or silicon oxynitride, onto a semiconductor substrate through use of PECVD.

PECVD utilizes an rf field to supply energy to gases within a reaction chamber or tube. The gases become excited and form glow discharge or plasma; plasma being defined as a partially ionized gas, and glow discharge being a plasma maintained over a specified pressure range (0.5 Torr–2 Torr). The plasma in turn transfers energy into reactant gases, also within the reaction chamber, to enhance the deposition of a thin film onto the substrate or layer formed on the substrate. For example, if silane ($SiH_4$), nitrous oxide ($N_2O$) and ammonia ($NH_3$) are used as reactant gases, a thin film of silicon nitride ($Si_xO_yN_z$) is deposited on the substrate. The major advantage of PECVD is that the substrate need not be heated to high temperatures for deposition to occur and it is therefore useful, for example, to prevent deterioration of materials, unwanted diffusion of dopants, etc. In addition, PECVD produces films with desirable properties such as strong adhesion and the ability to protect the substrate from corrosive agents.

However, PECVD deposited films often incur internal tensile or compressive stress which can cause cracking and peeling of the film or damage to the substrate (or overlying layers formed on the substrate). In the deposition of silicon oxynitride, the internal tension could destroy the film's passivation and protection properties. The mechanism which causes the film stress is not fully understood, but it is speculated to be caused by the incorporation of reaction by-products into the film such as hydrogen, nitrogen, and oxygen. Additionally, the difference in contraction coefficients between the underlying layers and the silicon nitride layer when cooling can cause stress. For higher temperature depositions, the inclusion of by-products into the film is less pronounced, but the advantage of using PECVD at low temperatures (i.e., low temperature processing) is lost.

Consequently, other means to control stress in films deposited through PECVD have been sought. It is known that films deposited at radio frequencies generally below 1 MHz exhibit compressive stress while those deposited at frequencies above 1 MHz exhibit tensile stress. It has been found that less stress in the film develops if dual frequency radio waves are used to generate the rf field in the reaction chamber. As discussed in Abstract No. 385 of *The Electrochemical Society*, volume 86-2, page 580, one such radio wave is generated at a frequency below 500 KHz and the other at a frequency above 4 MHz. These frequencies are generated simultaneously and continuously over a predetermined deposition period. In this instance, the power of the lower frequency radio wave is controlled and a film with a lower compressive stress than conventionally deposited films is obtained. The frequencies are generated below 500 KHz and above 4 MHZ because the interval between these frequencies corrsponds to the International Communications window and cannot be used without employing costly shielding.

In a related dual frequency method described in *Industry News*, "Controlling Stress in PECVD Silicon Nitride", page 15, March, 1988, the high and low frequencies are alternated over a deposition period such that silicon nitride films are deposited in alternating layers; one layer exhibiting tensile stress and the layer(s) adjacent exhibiting compressive stress. The composite film, therefore, does not favor compressive or tensile properties which helps to relax the stress in the film as a whole.

The presently invented process also employs the use of dual frequencies to control stress and allows for the deposition of a thin film with lower stress than possible by employing conventional methods. However, instead of generating the dual frequency radio waves in an alternating fashion or continuously over the deposition period, as in the prior art, the invented method strikes the gases in the reaction chamber with a low frequency, high voltage radio wave to enhance plasma formation and then triggers a lower voltage high frequency radio wave. The high frequency wave is capable of causing further gas ionization and hence plasma formation. This method offers several advantages over the prior art dual frequency methods especially for batch PECVD systems such as the ASM ® model plasma IIIA systems which can deposit up to 160 four-inch wafers at a time. (ASM ® is a registered trademark of Advanced Semiconductor Materials America, Inc.)

SUMMARY OF THE INVENTION

An improved method, using dual frequencies to lower stress in films deposited onto semiconductor substrates by means of plasma enhanced chemical vapor deposition is described. The preferred method utilizes a high voltage, low frequency striking pulse to overcome the activation energy of gas ionization (i.e., plasma formation), and then without losing the reaction inertia generated by the high voltage pulse, applies a lower voltage, high frequency pulse to plasma forming gases within a reaction chamber. The plasma transfers energy into reactant gases, such as silane ($SiH_4$), nitrous oxide ($N_2O$), and ammonia ($NH_3$), to form a thin film of silicon nitride ($Si_xO_yN_z$) onto a semiconductor substrate or to a layer formed on the substrate.

DESCRIPTION OF THE DRAWINGS

FIG. 1 is a schematic representation of a plasma enhanced chemical vapor deposition reaction system.

FIG. 2 is a block diagram of a radio frequency generation system used in the present invention.

FIG. 3A is a graphic representation of the currently preferred pulsing sequences used in the present invention.

FIG. 3B is a graphic representation of alternate pulsing sequences used in the present invention.

FIG. 3C is a graphic representation of another alternate pulsing sequence used in the present invention.

FIG. 3D is a graphic representation of the voltage appearing across the load/tube using the invented pulsing sequences.

FIG. 4 is a graphic representation of stress in dynes versus low frequency pulse width in milliseconds for a film deposited in accordance with the teachings of the present invention.

FIG. 5 is a cross-sectional elevation view of a contact mechanism used with the present invention.

DETAILED DESCRIPTION OF THE INVENTION

A method of using dual radio frequencies in the deposition of a thin film of silicon oxynitride onto a semiconductor substrate along with a contact mechanism for applying the pulses to a sled or the like is described. In the following description, numerous specific details are set forth such as the frequencies generated, pulse widths, etc. It will be obvious, however, to one skilled in the art that the present invention may be practiced without these specific details. In other instances, well-known structures such as the reaction chamber and rf generation means having not been shown in detail in order not to unnecessarily obscure the present invention.

FIG. 1 illustrates conventional reaction apparatus used in PECVD. The wafer or substrate is placed on a flat surface 1 within the reaction chamber 2. The substrate is positioned either horizontally or vertically depending on the type of chamber used and the type of holder used to hold the wafers or substrates. Reactant gases, for example, silane ($SiH_4$), nitrous oxide ($N_2O$) and ammonia ($NH_3$), are pumped into the chamber 2 via lines 4 as well as other gaseous species used in the formation of plasma. An rf generation system 5 is coupled to an electrode 3 located within the chamber 2. The electrode 3 in turn provides an rf field within the chamber 2. The apparatus of FIG. 1 also illustrates other well-known components such as the furnace control 6, pressure sensor 7, exhaust line 8. A number of different types of chambers can be used, some employing a single electrode and others a number of electrodes positioned parallel to one another within the chamber.

The present invention is directed to an rf generation system which is used for the rf generation system 5 of FIG. 1. Also a contact mechanism for making contact with the electrode is described (FIG. 5).

FIG. 2 illustrates the currently preferred embodiment of a rf generation system. The system comprises a high frequency (>1 MHz) generator 10 and a low frequency (<1 MHz) generator 11. (In general, in this application low frequency refers to a radio frequency signal below 1 MHz such as 55 MHz; high frequency refers to a radio frequency signal above 1 MHz such as 13.56 MHz.) The turning on pulse signals are regulated with respect to one another by a generator control interface means 12. A tuning box 13, monitor 14 and control 15 are used to adjust the impedance matching and maximize the power of the high frequency radio waves. A low frequency shunt or filter 17 shunts any lower than desired frequencies and prevents this low frequency energy from being passed to the high frequency generator 10. The rf signal from the generator 11 passes through a lowpass filter 18 to feedline 19. Both the high and low frequency rf signals are coupled to the electrode or electrodes in the chamber vis the feedline 19. While a parallel feeding arrangement is shown, it will be apparent to one skilled in the art that a series feeding arrangement may be used. Here the high voltage generator is coupled to one electrode and the low frequency generator to the other electrode.

A key to the present invention is the timing of the high and low frequency signals applied to the feedline 19. These are controlled by the control interface 12. Any one of numerous, well-known circuits may be used to generate the rf control pulses shown in FIG. 3A, FIG. 3B and FIG. 3C. It is the control signals from interface 12 which turn-on and turn-off the generators 10 and 11 thereby providing the waveforms of FIGS. 3A to 3C. The generation system of FIG. 2 thus is used to regulate the pulses of rf energy applied to the reaction gases over a predetermined film depositon period.

As illustrated graphically in FIG. 3A, in the preferred method, a first radio frequency control pulse 30 of approximately 55 KHz and power of 1000 W is generated and applied to the chamber. The pulse has a duration of approximately 6 msec. in the currently preferred method. That is, the 55 KHz generator is turned on for 6 msec. and the resultant rf envelope has the general pulse shape for pulse 30a as shown in FIG. 3D. (In general, FIG. 3A illustrates the control signals used to control the generation of the rf signals whereas FIG. 3D illustrates the voltage across the load (i.e., tube). This pulse is used to *strike* the gases within the reaction chamber 2 causing the gases to ionize and thus, forming plasma. Once the gases have begun to ionize, further ionization can be achieved by generating and applying the second, approximately 13 MHz pulse. The 13 MHz pulse 31 can be generated at a lower power of approximately 250 W, lower than the 55 KHz pulse power of 1000 W as the initial activation energy for gas ionization has been previously met by the 1000 W pulse. The second pulse has a duration of approximately 55 msec. in the currently preferred method. Again, it is the envelope of the 13 MHz signal which appears as pulse 31 of FIG. 3A and pulse 31a of FIG. 3D. In the preferred method, the 13 MHz pulse 31 is generated at the trailing edge of the 55 KHz pulse 30. This prevents the two frequencies (if generated simultaneously) from setting up interferences, causing the impedance of the reaction chamber to vary and hence affecting the rf generators. After a period of approximately 346 msec. the pulses 30 and 31 are repeated. The pulses are periodically repeated during the deposition process to allow time to pump out the depleted chemicals and replace them with fresh chemicals before another plasma strike. This method is known to improve large wafer load deposition uniformity.

In the alternate method of FIG. 3B the high frequency pulse 34 is triggered on the leading edge of the low frequency pulse 33. The high and low frequency pulses may be of the same duration as discussed for FIG. 3A. In another method, in FIG. 3C a short low frequency pulse 35 is first used followed by the high frequency pulse 36, and then another low frequency pulse 37.

The above method provides several advantages over the prior art. In a prior art method, alternate dual frequencies are used over the deposition period, resulting in a time span between the application of the high and low rf pulses. As a result, the initial activation energy for ionization of the gaseous species must be overcome by each pulse if maximum plasma formation is to be achieved. In contrast, the present method takes advantage of the high energy, 55 KHz plasma striking pulse, by generating and applying the 13 MHz pulse to the gases during or immediately following the 55 KHz pulse. Also, the method of FIG. 3A provides an advantage over those systems that simultaneously (and continuously) provide both high and low rf signals. The interference between the signals that cause variations in impedance is eliminated.

The high frequency energy more efficiently ionizes the gasses, compared to the low frequency energy once the plasma is struck. In fact, the ionization density is proportional to the frequency. Also, the high frequency deposition exhibits less sensitivity to silicon substrate resistivity, to the patterns formed on the substrate, and to the type of films present on the substrate.

FIG. 4 shows the stress versus the pulse width (for the low frequency 55 KHz pulse) when the waveforms of FIG. 3A and 3B are used in the deposition of silicon nitride. "TE" are the experimental points for the trailing edge triggering (FIG. 3A); "LE" are the experimental points for the leading edge triggering (FIG. 3B). Other conditions for the deposition are shown in FIG. 4.

As shown in FIG. 4, the stress of the silicon oxynitride film of the present invention can be varied from tensile to compressive stress. The desired stress film is achieved by controlling the low frequency pulse width as described and without changing other process parameters. In particular, the preferred method utilizes a low frequency rf striking pulse to overcome the activation energy for gas ionization and without loosing the reaction inertia generated by the high energy pulse, employs a low energy high frequency pulse. The plasma, in turn, transfers energy into reactant gases such as silane, nitrous oxide and ammonia. The increased energy enhances a reaction between the gases for the formation of silicon nitride on the substrate. Thus, a thin film of silicon oxynitride is formed over the semiconductor substrate of layer formed on the substrate. Because of the combination of high and low frequencies employed in the present method, the desired film stress can be selected.

In the presently preferred embodiment the reaction apparatus shown generally in FIG. 1 includes a sled which holds a plurality of wafers. The rf electrodes are interdigitated about the exterior of the sled, one electrode being coupled to the rf generation system for the parallel feed arrangement of FIG. 2, and the other electrode being coupled to ground. It is necessary to make contact with these electrodes after the sled has been placed within the chamber 2. FIG. 5 illustrates the mechanism used for providing electrical contact to these electrodes. Contact 50 is an ordinary metal part such as an inconel member. Two contacts, such as contact 50 are used; one is coupled to the generator, and the other to ground both through the wall of the chamber. The parts shown above this member in FIG. 5 are part of the sled; these parts provide an electrical path to the electrodes on the sled.

Electrical contact with the member 50 is made with the contact electrode 60 which again can be an ordinary metal member such as one fabricated from inconel. It is a generally cylindrical member having a contact electrode portion 53, shaft 54 and threaded end 56. A jam nut 55 engages the threaded end 56. Importantly, the contact electrode 53 is outwardly domed and engages member 50 at the central region 52. A concentrically mounted, generally cylindrical insulator collar 51 fits about the shaft 54 and electrode 53 and engages the flat surface of member 50. The insulator may be made of ordinary insulative material such as alumina.

In use, the threaded end 56 provides electrical contact to the sled and contact to the member 50 is made only at region 52 because of the domed electrode 53. The collar 51 prevents circulation of the gases in the chamber in the region of contact, and thus reduces the formation of the silicon oxynitride insulator particularly in the region 52. The shielded contact electrode 53 permits multiple depositions without having to clean the contact after each deposition.

We claim:

1. In the deposition of a thin film of silicon oxynitride onto a semiconductor substrate or layer formed on the semiconductor substrate by means of glow discharge or plasma in a reaction chamber, an improved method comprising:
   generating a first radio frequency pulse;
   striking a gas in a reaction chamber with said first pulse;
   generating a second radio frequency pulse being of higher frequency than said first pulse;
   applying said second pulse to said gas while said first pulse is still being generated;
   switching off said first pulse after a first predetermined span of time while said second pulse is still being generated;
   switching off said second pulse after a second predetermined span of time;
   repeating said pulses after a third predetermined span of time over a deposition period thereby generating a series of periodic pulses.

2. The improved method, as recited in claim 1, wherein said first pulse is generated at a voltage higher in magnitude than that of said second pulse.

3. The improved method, as recited in claim 1, wherein said first predetermined span of time is a shorter span of time than said second predetermined span of time.

4. The improved method as recited in claim 1, wherein said third predetermined span of time is a longer span of time than said first and said second predetermined spans of time.

5. The improved method defined by claim 1 wherein said first pulse is used to trigger the ON time of said second pulse.

6. In the use of plasma or glow discharge to transfer energy into reactant gases so as to deposit silicon oxynitride onto semiconductor substrate or onto a layer formed on the semiconductor substrate in a reaction chamber, an improved method comprising:
   generating a first radio frequency pulse with a frequency of approximately 55 KHz;
   striking a gas in said reaction chamber with said first pulse;
   applying a second radio frequency pulse to said gas while said first pulse is still being generated, said second pulse being generated at a frequency of approximately 13.56 MKz;
   switching off said first pulse after a first predetermined span of time while said second pulse is still being generated;
   switching off said second pulse after a second perdetermined span of time;
   repeating said pulses after a third predetermined span of time over a deposition period thereby generating a series of periodic pulses.

7. The improved method, as recited in claim 6, wherein said first pulse is generated at a voltage higher in magnitude than that of said second pulse.

8. The improved method, as recited in claim 6, wherein said first predetermined span of time is a shorter span of time than said second predetermined span of time.

9. The improved method, as recited in claim 6, wherein said third predetermined span of time is a longer span of time than said first and said second predetermined spans of time.

10. In the use of a radio frequency field to form glow discharge or a plasma in reaction chamber so as to transfers energy to reactant gases wherein silicon oxynitride is deposited onto a semiconductor substrate or on a layer formed on the semiconductor substrate, an improved method comprising:
  generating a first radio frequency pulse of a first frequency and of a first pulse width;
  striking a gas in said reaction chamber with said first pulse;
  triggering a second radio frequency pulse with the leading edge of said first pulse;
  generating said second pulse at a second frequency and a second pulse width, said first frequency being lower than said second frequency, and said second pulse width being greater than said first pulse width;
  repeating said pulses over a predetermined deposition period thereby generating a series of periodic pulses.

11. The improved method, as recited in claim 10, wherein said first pulse is generated at a power higher in magnitude than that of said second pulse.

12. The improved method, as cited in claim 10, wherein said first frequency is approximately 55 KHz, and said second frequency is approximately 13.56 MHz.

13. In the use of plasma or glow discharge to transfer energy into reactant gases to deposit silicon oxynitride onto a semiconductor substrate or on a layer formed on the semiconductor substrate in a reaction chamber, an improved method comprising:
  generating a first radio frequency pulse of a first frequency and of a first pulse width;
  striking gas in said reaction chamber with said first pulse;
  triggering a second radio frequency pulse with the trailing edge of said first pulse;
  generating said second pulse at a second frequency and a second pulse width, said first frequency being lower than said second frequency, and said second pulse width being greater than said first pulse width;
  repeating said pulses over a predetermined deposition period thereby generating a series of periodic pulses.

14. The improved method as recited in claim 13, wherein said first pulse is generated at a voltage higher in magnitude than that of said second pulse.

15. The improved method, as recited in claim 13, wherein said first frequency is approximately 55 KHz, and said second frequency is approximately 13.56 MHz.

16. In the use of a radio frequency field to form glow discharge or a plasma in a reaction chamber so as to transfer energy to reactant gases wherein silicon oxynitride is deposited onto a semiconductor substrate or on a layer formed on the semiconductor substrate, an improved method comprising:
  generating a first radio frequency pulse;
  striking a gas in said reaction chamber with said first pulse; triggering a second radio frequency pulse with the trailing edge of said first pulse;
  generating a third radio frequency pulse after said second pulse;
  said first and third pulse being of the same radio frequency and being lower in frequency than said second pulse;
  repeating said pulses over a predetermined deposition period thereby generating a series of periodic pulses.

* * * * *

UNITED STATES PATENT AND TRADEMARK OFFICE
CERTIFICATE OF CORRECTION

PATENT NO. : 4,837,185

DATED : 6/6/89

INVENTOR(S) : Yau et al.

It is certified that error in the above-identified patent and that said Letters Patent is hereby corrected as shown below:

| | | |
|---|---|---|
| col. 02, line 08 | delete "corrsponds" | insert --corresponds-- |
| col. 03, line 23 | delete "having" | insert --have-- |
| col. 03, line 53 | after "55", delete "MH " | insert --KH -- |
| col. 03, line 66 | delete "vis" | insert --via-- |
| col. 05, line 38 | delete "of" | insert --or-- |
| col. 06, line 60 | delete "MK " | insert --MH -- |
| col. 06, line 64 | delete "perdetermined" | insert --predetermined-- |

Signed and Sealed this

Fifth Day of February, 1991

*Attest:*

HARRY F. MANBECK, JR.

*Attesting Officer*    *Commissioner of Patents and Trademarks*